United States Patent
Tamaso

(10) Patent No.: US 8,823,017 B2
(45) Date of Patent: Sep. 2, 2014

(54) SEMICONDUCTOR DEVICE AND METHOD OF MANUFACTURING THE SAME

(75) Inventor: Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 20 days.

(21) Appl. No.: 13/579,482

(22) PCT Filed: Oct. 19, 2011

(86) PCT No.: PCT/JP2011/073995
§ 371 (c)(1),
(2), (4) Date: Aug. 16, 2012

(87) PCT Pub. No.: WO2012/060222
PCT Pub. Date: May 10, 2012

(65) Prior Publication Data
US 2012/0319135 A1    Dec. 20, 2012

(30) Foreign Application Priority Data

Nov. 1, 2010    (JP) .................................. 2010-245149

(51) Int. Cl.
*H01L 29/15*    (2006.01)
(52) U.S. Cl.
USPC ........................................... 257/77; 438/612
(58) Field of Classification Search
USPC ................ 438/584, 597, 612–617, 602, 931; 257/76–78, 744, E23.155, E21.159, 257/E29.104, E29.082, E21.589
See application file for complete search history.

(56) References Cited

U.S. PATENT DOCUMENTS

| | | | |
|---|---|---|---|
| 7,829,374 B2 * | 11/2010 | Hayashi et al. | 438/99 |
| 2010/0102331 A1 * | 4/2010 | Fujikawa et al. | 257/77 |
| 2010/0244048 A1 * | 9/2010 | Hayashi et al. | 257/77 |

FOREIGN PATENT DOCUMENTS

| | | |
|---|---|---|
| JP | 64-022026 | 1/1989 |
| JP | 07-099169 | 4/1995 |
| JP | 2006-202883 | 8/2006 |
| JP | 2007-534143 | 11/2007 |
| JP | 2008-117923 | 5/2008 |
| JP | 2009-509339 | 3/2009 |
| JP | 2010-062402 | 3/2010 |
| JP | 2010-103229 | 5/2010 |
| WO | WO-2005/020308 A1 | 3/2005 |
| WO | WO-2007/035333 A1 | 3/2007 |

OTHER PUBLICATIONS

SiC Sosi no Kiso to Ouyou, co-edited by Kazuo Arai and Sadafumi Yoshida, Ohmsha, Ltd., Mar. 2003, pp. 116-118.*

* cited by examiner

*Primary Examiner* — Julio J Maldonado
*Assistant Examiner* — Robert Bachner
(74) *Attorney, Agent, or Firm* — Venable LLP; Michael A. Sartori; F. Brock Riggs

(57) ABSTRACT

An electrode layer lies on a silicon carbide substrate in contact therewith and has Ni atoms and Si atoms. The number of Ni atoms is not less than 67% of the total number of Ni atoms and Si atoms. A side of the electrode layer at least in contact with the silicon carbide substrate contains a compound of Si and Ni. On a surface side of the electrode layer, C atom concentration is lower than Ni atom concentration. Thus, improvement in electrical conductivity of the electrode layer and suppression of precipitation of C atoms at the surface of the electrode layer can both be achieved.

12 Claims, 5 Drawing Sheets

(A)

(B)

SEMICONDUCTOR DEVICE AND METHOD OF MANUFACTURING THE SAME

TECHNICAL FIELD

The present invention relates to a semiconductor device and a method of manufacturing the same, and more particularly to a semiconductor device having a silicon carbide substrate and a method of manufacturing the same.

BACKGROUND ART

For a method of manufacturing a semiconductor device including a silicon carbide substrate, a technique for forming an ohmic electrode on the silicon carbide substrate has been developed.

For example, according to Japanese Patent Laying-Open No. 7-99169 (PTL 1), by forming an Ni—Si alloy layer or a stack of Si and Ni on an SiC base (a silicon carbide substrate), $NiSi_2$ (33 atomic % of Ni and 67 atomic % of Si) can be formed without supply of Si from the SiC base and an electrode in ohmic contact with the SiC base is obtained. In addition, according to this publication, when Ni is not more than 33% in an atomic ratio, Si is excessive and conductivity is impaired, and when Ni is not less than 67%, excessive Ni is present at an interface between $NiSi_2$ and SiC and the interface becomes discontinuous. Further, according to this publication, since Si is not supplied from SiC, such a phenomenon that excessive C diffuses into Ni and it is precipitated as graphite at a surface of an electrode does not occur.

CITATION LIST

Patent Literature

PTL 1: Japanese Patent Laying-Open No. 7-99169

SUMMARY OF INVENTION

Technical Problem

As described above, in forming an electrode (electrode layer) having Ni atoms and Si atoms, in order to enhance electrical conductivity of the electrode layer, a ratio of Ni should be increased. When the ratio of Ni is increased, many C atoms are precipitated from the silicon carbide substrate to the surface of the electrode layer during annealing for forming the electrode layer. Therefore, it has been difficult to achieve both of enhancement in electrical conductivity of the electrode layer and suppression of precipitation of C atoms at the surface of the electrode layer.

Therefore, an object of the present invention is to provide a semiconductor device capable of achieving both of improvement in electrical conductivity of an electrode layer and suppression of precipitation of C atoms at a surface of the electrode layer and a method of manufacturing the same.

Solution to Problem

A semiconductor device according to the present invention has a silicon carbide substrate and an electrode layer. The electrode layer lies on the silicon carbide substrate in contact therewith and has Ni atoms and Si atoms. The number of Ni atoms is not less than 67% of the total number of Ni atoms and Si atoms. A side of the electrode layer at least in contact with the silicon carbide substrate contains a compound of Si and Ni. On a surface side of the electrode layer, C atom concentration is lower than Ni atom concentration.

According to this semiconductor device, in the electrode layer, the number of Ni atoms is not less than 67% of the total number of Ni atoms and Si atoms. Thus, as compared with a case where this percentage is lower than 67%, electrical conductivity of the electrode layer can be enhanced. In addition, according to this semiconductor device, on the surface side of the electrode layer, C atom concentration is lower than Ni atom concentration. Thus, when a metal pad layer in contact with the surface side of the electrode layer is formed, this metal pad layer is less likely to peel off.

Preferably, on the surface side of the electrode layer, C atom concentration is lower than 3%.

Preferably, the semiconductor device has a metal pad layer in contact with the surface side of the electrode layer. The metal pad layer is preferably an Al layer. Preferably, the metal pad layer includes an adhesive layer formed on the electrode layer and a main body layer formed on the adhesive layer. The adhesive layer is composed of any of Ti, TiW, and TiN.

Preferably, Si atom concentration on the surface side of the electrode layer is lower than 30%. Thus, electrical conductivity of the electrode layer can further be enhanced.

A method of manufacturing a semiconductor device according to the present invention has the following steps. A silicon carbide substrate is prepared. A material layer lying on the silicon carbide substrate in contact therewith and having Ni atoms and Si atoms is formed. The number of Ni atoms is not less than 67% of the total number of Ni atoms and Si atoms. By annealing the material layer with laser beams, an electrode layer of which side at least in contact with the silicon carbide substrate contains a compound of Si and Ni is formed.

According to this method of manufacturing a semiconductor device, in the material layer serving as a material for the electrode layer, the number of Ni atoms is not less than 67% of the total number of Ni atoms and Si atoms. Thus, as compared with a case where this percentage is lower than 67%, electrical conductivity of the electrode layer can be enhanced. In addition, according to this method of manufacturing a semiconductor device, annealing is carried out in a short period of time by using laser beams. Thus, as compared with a case where annealing is carried out for a longer period of time, diffusion of C atoms can be suppressed. Therefore, C atom concentration on the surface side of the electrode layer can be lowered. Thus, when a metal pad layer in contact with the surface side of the electrode layer is formed, this metal pad layer is less likely to peel off.

Preferably, a metal pad layer is formed on the electrode layer. The metal pad layer preferably includes an Al layer. Preferably, the step of forming a metal pad layer includes the steps of forming an adhesive layer on the electrode layer and forming a main body layer on the adhesive layer. The adhesive layer is composed of any of Ti, TiW, and TiN.

The step of forming a material layer may include the step of forming a mixed layer of Si and Ni. Alternatively, the step of forming a material layer may include the step of stacking an Si layer and an Ni layer.

Advantageous Effects of Invention

As described above, according to the present invention, enhancement in electrical conductivity of the electrode layer and suppression of precipitation of C atoms at the surface of the electrode layer can both be achieved.

DESCRIPTION OF EMBODIMENTS

An embodiment of the present invention will be described hereinafter with reference to the drawings.

(First Embodiment)

Figure 1:
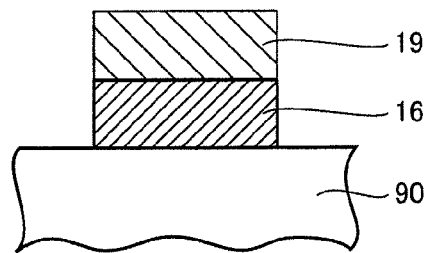
FIG. 1 is a cross-sectional view schematically showing a construction of a semiconductor device in a first embodiment of the present invention.

Referring to FIG. 1, a semiconductor device in the present embodiment has a silicon carbide substrate 90, an electrode layer 16, and a metal pad layer 19.

Electrode layer 16 lies on silicon carbide substrate 90 in contact therewith and has Ni atoms and Si atoms. The number of Ni atoms is not less than 67% of the total number of Ni atoms and Si atoms. More specifically, general composition of a material for electrode layer 16 is a mixture of Ni not lower than 67 atomic % and Si which is a substantial remainder. It is noted that an additive other than Ni and Si may be added to a material for electrode layer 16 as necessary. In addition, a material for electrode layer 16 may contain an inevitable impurity in an industrial manufacturing method.

Preferably, the number of Si atoms in electrode layer 16 is not less than 10% of the total number of Ni atoms and Si atoms.

A side of electrode layer 16 at least in contact with silicon carbide substrate 90 contains a compound of Si and Ni, that is, nickel silicide. Thus, electrode layer 16 and silicon carbide substrate 90 establish ohmic contact with each other. Namely, electrode layer 16 has a function as an ohmic electrode.

On a side of electrode layer 16 in contact with silicon carbide substrate 90 (a lower side in the drawing), the compound above is generally $Ni_2Si$. Namely, on the side of electrode layer 16 in contact with silicon carbide substrate 90, a ratio of the number of Ni atoms to the total number of atoms of Ni and Si is approximately ⅔, that is, approximately 67%. This ratio is higher on the surface side (an upper side in the drawing) of electrode layer 16, and in an extreme case, it may be a value close to 100%. Namely, aside from an inevitable impurity in an industrial manufacturing method or inevitable deposits from an external environment, the surface side of electrode layer 16 may substantially be composed of Ni. In this case, electrical conductivity on the surface side of electrode layer 16 is higher than in a case where Si is significantly contained.

On the surface side of electrode layer 16, C atom concentration is lower than Ni atom concentration. Preferably, this C atom concentration is lower than 3% and more preferably lower than 1%. More preferably, substantially no C atom is present on the surface side of electrode layer 16. Namely, aside from deposition of inevitable C atoms from an external environment, the surface side of electrode layer 16 may substantially be composed of Ni.

Here, atomic concentration on the surface side refers to a ratio of the number of specific atoms to the total number of atoms in a region extending from a surface (an upper surface in the drawing) of electrode layer 16 to a depth of 5 nm. This atomic concentration can be measured with element analysis high in resolution in a direction of depth, and it can be measured, for example, with SIMS (Secondary Ion Mass Spectroscopy). If a surface of electrode layer 16 is exposed to atmosphere in an operation for preparation for measurement, the surface of electrode layer 16 should be cleaned. Cleaning is, for example, ultrasonic cleaning using such an organic solvent as acetone.

Preferably, the surface of electrode layer 16 itself is a surface from which no substance has been removed by etching, polishing, or the like. Thus, the step of forming electrode layer 16 is further simplified. Even in this case, however, a contaminant that has deposited onto the surface of electrode layer 16 from an external environment after electrode layer 16 is formed may be removed. Removal can be achieved, for example, by cleaning as described above.

Metal pad layer 19 is in contact with the surface side of electrode layer 16. Preferably, metal pad layer 19 is either an Al layer or an Al—Si layer.

A method of manufacturing a semiconductor device in the present embodiment will now be described.

Figure 2:
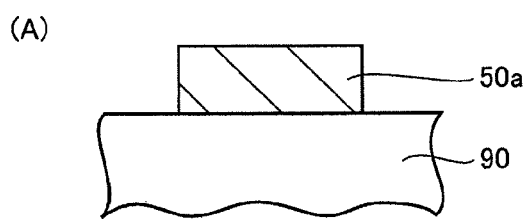
FIG. 2 is a cross-sectional view schematically showing a first step (A) and a second step (B) in a method of manufacturing the semiconductor device in FIG. 1.
Figure 2:
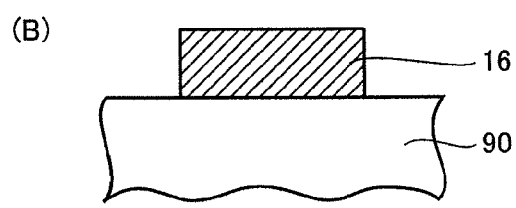

Referring to FIG. 2(A), silicon carbide substrate 90 is initially prepared. Then, a material layer 50a lying on silicon carbide substrate 90 in contact therewith and having Ni atoms and Si atoms is formed. The number of Ni atoms is not less than 67% of the total number of Ni atoms and Si atoms. Material layer 50a is a mixed layer of Si and Ni. This mixed layer can be formed, for example, by simultaneously sputtering a target composed of Si and a target composed of Ni.

Preferably, the number of Si atoms in material layer 50a is not less than 10% of the total number of Ni atoms and Si atoms.

Referring further to FIG. 2(B), as annealing treatment, silicon carbide substrate 90 on which material layer 50a (FIG. 2(A)) has been formed is irradiated with laser beams. As a result of this annealing, electrode layer 16 (FIG. 2(B)) is formed from material layer 50a. This annealing is carried out such that a side of electrode layer 16 at least in contact with silicon carbide substrate 90 contains a compound of Si and Ni, that is, nickel silicide.

Preferably, the laser beams have a wavelength not longer than 386 nm, which is a wavelength corresponding to a band gap of silicon carbide. Thus, laser beams are absorbed in the surface of silicon carbide substrate 90. Light beams having a wavelength of 355 nm, which are third harmonics of YAG laser or $YVO_4$ laser, can be employed as such laser beams.

Output density of laser beams is not less than 0.5 $J/cm^2$ and not more than 1.5 $J/cm^2$ and more preferably not less than 0.7 $J/cm^2$ and not more than 1.3 $J/cm^2$. Thus, a sufficient annealing function can be obtained and damage due to laser beams can be suppressed.

Laser beams have a pulse width not less than 10 ns and not more than 10 μs and more preferably not less than 50 ns and not more than 1 μs. Thus, annealing can be carried out in a sufficiently short period of time while laser having a practical pulse width is being used.

Referring again to FIG. 1, metal pad layer 19 is formed on electrode layer 16. Metal pad layer 19 is preferably an Al layer. The semiconductor device in the present embodiment is obtained as above.

According to the semiconductor device in the present embodiment, in electrode layer 16, the number of Ni atoms is not less than 67% of the total number of Ni atoms and Si atoms. Thus, as compared with a case where this percentage is lower than 67%, electrical conductivity of electrode layer 16 can be enhanced. In addition, according to this semiconductor device, the surface side of electrode layer 16 has C atom concentration lower than the sum of Si atom concentration and Ni atom concentration. Thus, when metal pad layer 19 in contact with the surface side of electrode layer 16 is formed, this metal pad layer 19 is less likely to peel off.

Preferably, Si atom concentration on the surface side of electrode layer 16 is lower than 30%. Thus, electrical conductivity of electrode layer 16 can further be enhanced.

In addition, according to the method of manufacturing a semiconductor device in the present embodiment, in material layer 50a serving as a material for electrode layer 16, the number of Ni atoms is not less than 67% of the total number of Ni atoms and Si atoms. Thus, as compared with a case where this percentage is lower than 67%, electrical conductivity of electrode layer 16 can be enhanced.

Further, by using laser beams, annealing is carried out in a short period of time. Thus, as compared with a case where annealing for a longer period of time, such as lamp annealing, is carried out, diffusion of C atoms can be suppressed. Therefore, C atom concentration on the surface side of electrode layer 16 can be lowered. Thus, when metal pad layer 19 in contact with the surface side of electrode layer 16 is formed, metal pad layer 19 is less likely to peel off.

Preferably, the number of Ni atoms in electrode layer 16 or material layer 50a is not less than 70% of the total number of Ni atoms and Si atoms. Thus, the function and effect described above can more reliably be obtained. Further preferably, the number of Ni atoms is not more than 90% of the total number of Ni atoms and Si atoms. Thus, diffusion of C atoms from silicon carbide substrate 90 can further be suppressed.

A variation of the present embodiment will now be described.

Figure 3:
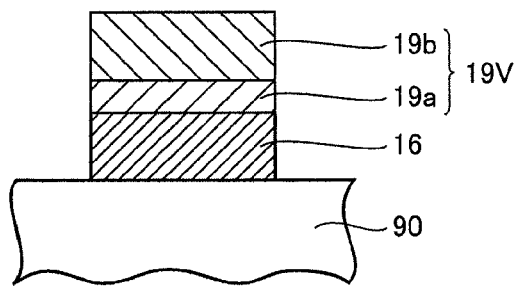
FIG. 3 is a cross-sectional view schematically showing a variation of the semiconductor device in FIG. 1.

Referring to FIG. 3, a metal pad layer 19V in a semiconductor device according to the present variation includes an adhesive layer 19a formed on electrode layer 16 and a main body layer 19b formed on adhesive layer 19a. Adhesive layer 19a is composed of any of Ti, TiW, and TiN. Main body layer 19b is preferably an Al layer or an Al—Si layer.

According to the present variation, adhesion of metal pad layer 19V to electrode layer 16 can further be enhanced.

(Second Embodiment)

Figure 4:
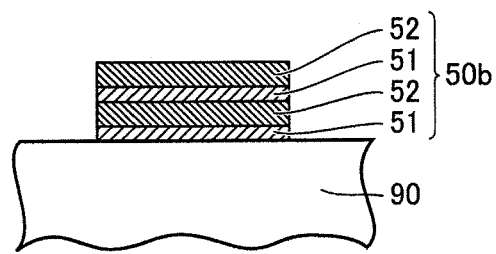
FIG. 4 is a cross-sectional view schematically showing one step in a method of manufacturing a semiconductor device in a second embodiment of the present invention.

Referring mainly to FIG. 4, in the present embodiment, a material layer 50b is formed instead of material layer 50a (FIG. 2(A)). The step of forming material layer 50b includes the step of stacking an Si layer 51 and an Ni layer 52. Preferably, an uppermost layer of the formed stack is Ni layer 52. Thus, since a ratio of Ni atoms on the surface side of electrode layer 16 obtained after annealing can be increased, electrical conductivity on the surface side of electrode layer 16 can be enhanced.

Since features other than the above are substantially the same as those in the first embodiment described above, the same or corresponding elements have the same reference characters allotted and description thereof will not be repeated.

According to the present embodiment, it is not necessary to form a mixed layer of Ni and Si as in the first embodiment.

(Third Embodiment)

In the present embodiment, one example of a further detailed structure of the semiconductor device in the first or second embodiment described above will be described.

Figure 5:
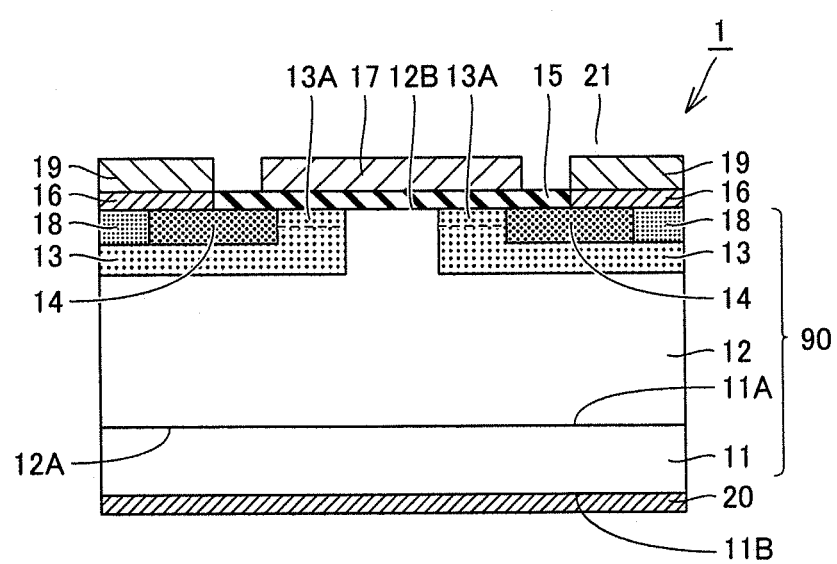
FIG. 5 is a cross-sectional view schematically showing a construction of a semiconductor device in a third embodiment of the present invention.

Referring to FIG. 5, a semiconductor device in the present embodiment is a vertical MOSFET (Metal Oxide Semiconductor Field Effect Transistor), and it has silicon carbide substrate 90, electrode layer 16, metal pad layer 19, a gate insulating film 15, and a gate electrode 17. Silicon carbide substrate 90 has an $n^+$ layer 11, an $n^-$ layer 12, a p body layer 13, an $n^+$ source region 14, and a $p^+$ region 18.

Electrode layer 16 is provided so as to be in ohmic contact with each of $n^+$ source region 14 and $p^+$ region 18 at one surface (an upper surface in the drawing) of silicon carbide substrate 90. Electrode layer 16 has a thickness, for example, approximately from 100 to 200 nm.

Gate electrode 17 is provided on one surface (the upper surface in the drawing) of silicon carbide substrate 90 with gate insulating film 15 being interposed, and it is opposed to a channel region 13A which is a surface side of p body layer 13. In addition, on the other surface (a lower surface in the drawing) of silicon carbide substrate 90, a drain electrode 20 is provided.

According to the present embodiment, a vertical MOSFET having electrode layer 16 high in electrical conductivity and metal pad layer 19 less likely to peel off is obtained.

It is noted that a vertical IGBT (Insulated Gate Bipolar Transistor) may be constructed instead of a vertical MOSFET by forming a p collector layer on a side of silicon carbide substrate 90 facing drain electrode 20. Alternatively, a structure in which a gate electrode is embedded in a trench formed in a silicon carbide substrate with a gate insulating film being interposed (a trench gate structure) may be employed.

(Comparative Example)

A comparative example of the present invention will be described with reference to data of a concentration profile using SIMS. Since a metal pad layer was not formed on a surface of a metal layer, a portion in the vicinity of a sputtering time period of 0 in a concentration profile corresponds to a surface of an electrode layer. In addition, a sputtering rate was set to approximately 10 nm/minute. Further, before measurement, surface cleaning treatment was performed. A comparative example will specifically be described below.

(First Comparative Example)

An Ni layer was employed instead of material layer 50a. In addition, lamp annealing was employed instead of laser annealing.

Figure 6:
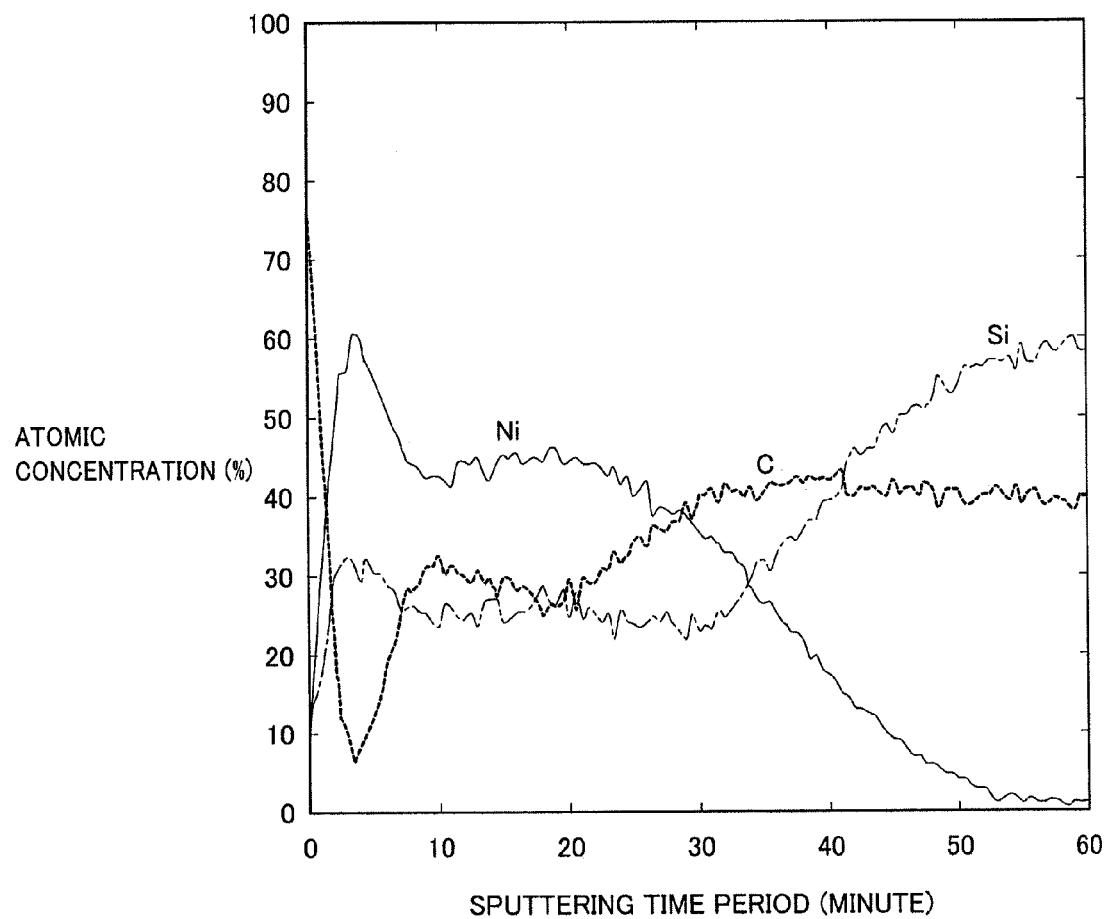
FIG. 6 shows an atomic concentration profile of a semiconductor device in a first comparative example.

Referring to FIG. 6, at a surface of an electrode layer (in the vicinity of 0 on the abscissa of the graph), C atoms occupied half or more of atoms. In addition, across the entire electrode layer, each of C atoms and Si atoms was present at a significant ratio. Further, Ni atoms diffused toward a deeper portion, that is, toward the inside of the silicon carbide substrate.

(Second Comparative Example)

Such a stack as having Ni of 80 atomic % and Si of 20 atomic % was employed as material layer 50b (FIG. 4). In addition, lamp annealing was employed instead of laser annealing.

Figure 7:
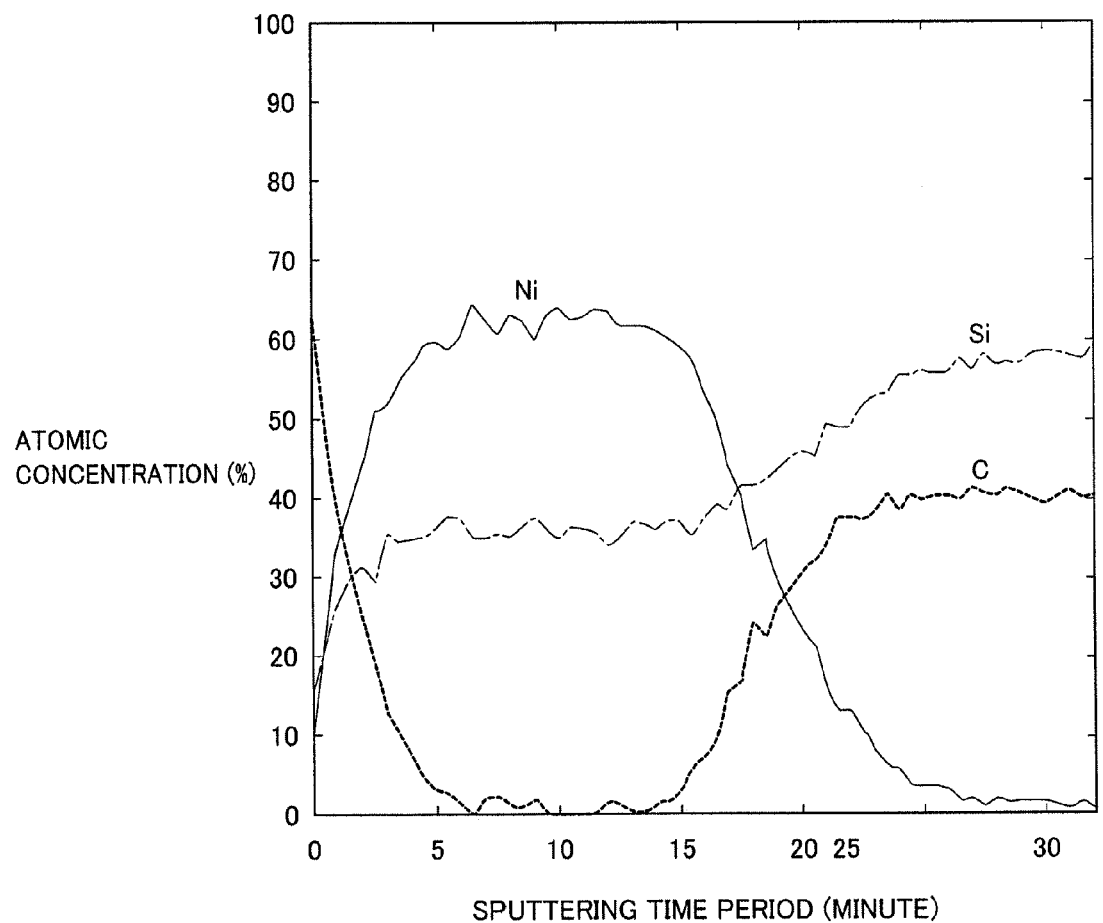
FIG. 7 shows an atomic concentration profile of a semiconductor device in a second comparative example.

Referring to FIG. 7, as in the first comparative example, at the surface of the electrode layer (in the vicinity of 0 on the abscissa of the graph), C atoms occupied half or more of atoms.

(Third Comparative Example)

A layer lower in Ni ratio was employed instead of material layer 50a (FIG. 2(A)). Specifically, a mixed layer having composition of Ni of 65 atomic % and Si of 35 atomic % was employed. In addition, lamp annealing was employed instead of laser annealing. Average electrical conductivity of the obtained electrode layer was lower than in the example of the present invention.

Figure 8:
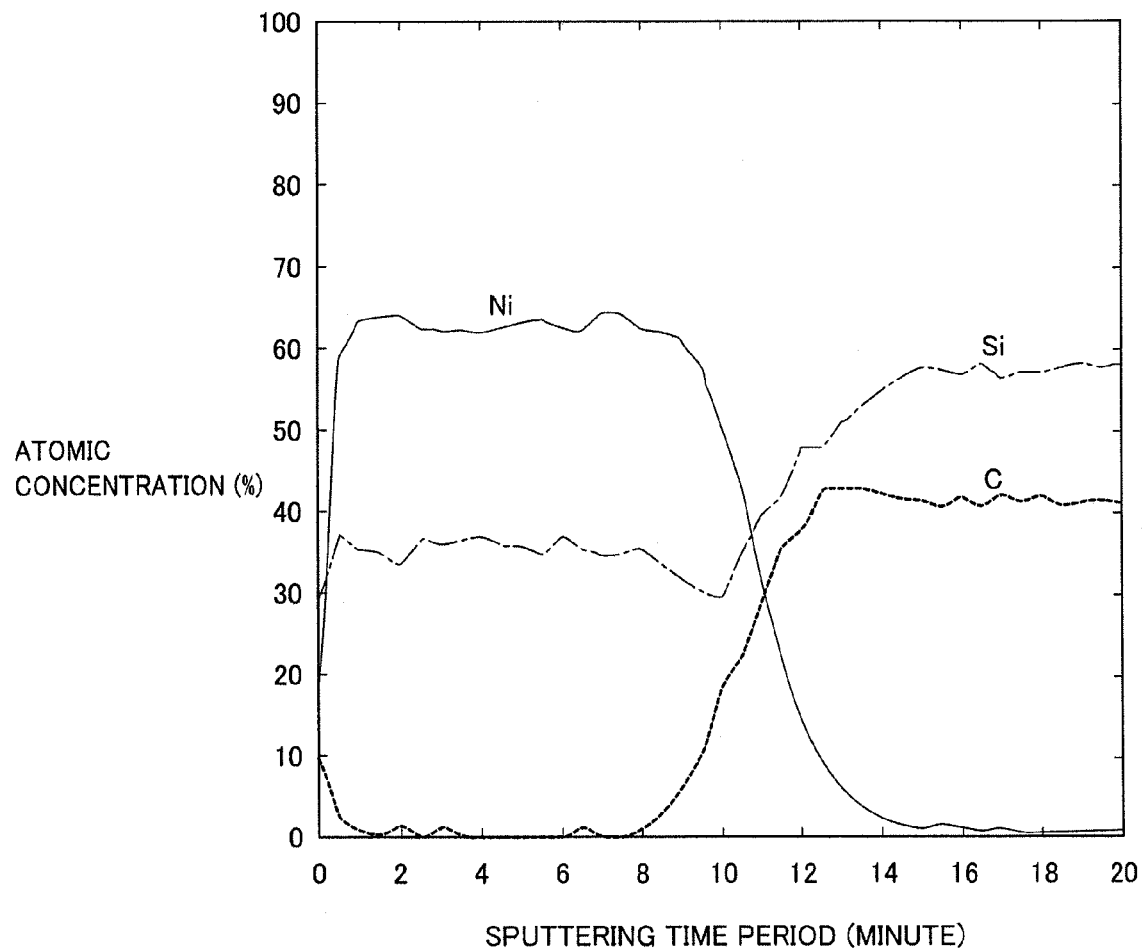
FIG. 8 shows an atomic concentration profile of a semiconductor device in a third comparative example.

Referring to FIG. 8, across the entire electrode layer, Si atoms were present at a significant ratio. Namely, in the electrode layer, there was no portion composed substantially of Ni.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 16 electrode layer; 19 metal pad layer; 50a, 50b material layer; 51 Si layer; 52 Ni layer; and 90 silicon carbide substrate.

The invention claimed is:

1. A semiconductor device, comprising:
    a silicon carbide substrate; and
    an electrode layer lying on said silicon carbide substrate in contact therewith and having Ni atoms and Si atoms,
    the number of said Ni atoms being not less than 67% of total number of said Ni atoms and said Si atoms at an interface of said electrode layer and said silicon carbide substrate,
    at least a side of said electrode layer in contact with said silicon carbide substrate containing a compound of Si and Ni, and
    on a surface side of said electrode layer, C atom concentration being lower than Ni atom concentration.

2. The semiconductor device according to claim 1, wherein on the surface side of said electrode layer, C atom concentration is lower than 3%.

3. The semiconductor device according to claim 1, further comprising a metal pad layer in contact with the surface side of said electrode layer.

4. The semiconductor device according to claim 3, wherein said metal pad layer includes an Al layer.

5. The semiconductor device according to claim 3, wherein said metal pad layer includes an adhesive layer formed on said electrode layer and a main body layer formed on said adhesive layer, and said adhesive layer is composed of any of Ti, TiW, and TiN.

6. The semiconductor device according to claim 1, wherein Si atom concentration on the surface side of said electrode layer is lower than 30%.

7. A method of manufacturing a semiconductor device, comprising the steps of:
    preparing a silicon carbide substrate;
    forming a material layer lying on said silicon carbide substrate in contact therewith and having Ni atoms and Si atoms, the number of said Ni atoms being not less than 67% of total number of said Ni atoms and said Si atoms at an interface of said material layer and said silicon carbide substrate; and
    forming an electrode layer by annealing said material layer with laser beams, at least a side of said electrode layer in contact with said silicon carbide substrate containing a compound of Si and Ni.

8. The method of manufacturing a semiconductor device according to claim 7, further comprising the step of forming a metal pad layer on said electrode layer.

9. The method of manufacturing a semiconductor device according to claim 8, wherein
    said metal pad layer includes an Al layer.

10. The method of manufacturing a semiconductor device according to claim 8, wherein
    said step of forming a metal pad layer includes the steps of forming an adhesive layer on said electrode layer and forming a main body layer on said adhesive layer, and said adhesive layer is composed of any of Ti, TiW, and TiN.

11. The method of manufacturing a semiconductor device according to claim 7, wherein
    said step of forming a material layer includes the step of forming a mixed layer of Si and Ni.

12. The method of manufacturing a semiconductor device according to claim 7, wherein
    said step of forming a material layer includes the step of stacking an Si layer and an Ni layer.

* * * * *